United States Patent
Money et al.

(10) Patent No.: US 11,841,249 B2
(45) Date of Patent: Dec. 12, 2023

(54) CAPACITIVE SENSING

(71) Applicant: TouchNetix Limited, Fareham (GB)

(72) Inventors: Robert Money, Fareham (GB); Peter Timothy Sleeman, Waterlooville (GB)

(73) Assignee: TouchNetix Limited, Farebam/Hampshire (GB)

( * ) Notice: Subject to any disclaimer, the term of this patent is extended or adjusted under 35 U.S.C. 154(b) by 330 days.

(21) Appl. No.: 16/960,944

(22) PCT Filed: Nov. 20, 2018

(86) PCT No.: PCT/GB2018/053354
§ 371 (c)(1),
(2) Date: Jul. 9, 2020

(87) PCT Pub. No.: WO2019/141958
PCT Pub. Date: Jul. 25, 2019

(65) Prior Publication Data
US 2021/0081073 A1     Mar. 18, 2021

(30) Foreign Application Priority Data
Jan. 16, 2018   (GB) .................................. 1800671

(51) Int. Cl.
*G01D 5/24*     (2006.01)
*G01D 5/241*    (2006.01)
(Continued)

(52) U.S. Cl.
CPC .............. *G01D 5/24* (2013.01); *G01D 5/241* (2013.01); *G01D 5/2417* (2013.01); *G06F 3/044* (2013.01);
(Continued)

(58) Field of Classification Search
CPC .............. G06F 3/0418; G06F 3/044; G06F 2203/04104; G01D 5/2417
See application file for complete search history.

(56) References Cited

U.S. PATENT DOCUMENTS

| | | | |
|---|---|---|---|
| 2009/0032312 A1 | 2/2009 | Huang et al. | |
| 2011/0006787 A1* | 1/2011 | Kadono | G06F 3/041 324/658 |
| 2012/0256868 A1* | 10/2012 | Choi | G06F 3/04182 345/174 |

FOREIGN PATENT DOCUMENTS

| | | | |
|---|---|---|---|
| CN | 106293299 | * | 1/2017 |
| EP | 3 016 285 A1 | | 5/2016 |

(Continued)

OTHER PUBLICATIONS

International Search Report and Written Opinion for corresponding International Patent Application No. PCT/GB2018/053354 dated Feb. 22, 2019.

(Continued)

*Primary Examiner* — Son T Le
(74) *Attorney, Agent, or Firm* — Renner, Otto, Boisselle & Sklar (57) ABSTRACT

A displacement sensor comprising: a first electrode and a second electrode displaceably mounted relative to the first electrode; capacitance measurement circuitry configured to make measurements of a capacitance associated with the first and second electrodes and to generate analogue capacitance measurement signals in response thereto; compensation circuitry configured to generate a compensated analogue capacitance measurement signal by reducing a magnitude of a current analogue capacitance measurement signal by an amount indicated by a compensation signal derived from at least one previous analogue capacitance measurement signal; and processing circuitry configured to (Continued)

digitise the compensated analogue capacitance measurement signal and to determine if there is a displacement of the second electrode relative to the first electrode based on the compensated analogue capacitance measurement signal.

15 Claims, 5 Drawing Sheets

(51) Int. Cl.
*G06F 3/041* (2006.01)
*G06F 3/044* (2006.01)

(52) U.S. Cl.
CPC .. *G06F 3/0418* (2013.01); *G06F 2203/04104* (2013.01)

(56) References Cited

FOREIGN PATENT DOCUMENTS

| GB | 2 533 949 A | 7/2016 |
|----|-------------|--------|
| GB | 2540768 A | 2/2017 |

OTHER PUBLICATIONS

United Kingdom Combined Search and Examination Report for corresponding GB Application No. GB1800671.8 dated Jul. 9, 2018.

* cited by examiner

Fig. 11

CAPACITIVE SENSING

BACKGROUND OF THE INVENTION

The present invention relates to capacitive sensors and methods of capacitive sensing, for example for detecting displacements.

Capacitive sensing techniques have become widespread for providing touch-sensitive inputs, for example in computer tablets, mobile phones, and in many other applications. Touch sensitive input devices are generally perceived to be more aesthetically pleasing than input devices that are based on mechanical switches. Nonetheless, there are still situations in which a user-interface that is responsive to mechanical input may be desired. In particular, there are situations in which there is a desire to measure the physical displacement of a displacement element, for example to provide the equivalent of a "click" when navigating a cursor across a display screen using a touch sensor. Furthermore, the inventors have recognised it can be desirable to provide such functionality using capacitive sensing techniques rather than mechanical switching techniques. Not only can capacitive sensing techniques provide for more reliable sensors (as they are less prone to mechanical wear), there may be situations in which displacement sensing is desired in conjunction with other sensors based on capacitive sensing (for example to measure the displacement of a capacitive touch screen), and so it can be convenient to adopt the same sensing technologies for both touch position and displacement sensing aspects.

One issue with using capacitive sensing techniques is there can often be a need to measure a relatively small change in a capacitance against a relatively large background/base line capacitance. While this can arise in the context of a simple capacitive touch sensor (e.g. a sensor responsive to a change in capacitance caused by an object brought into proximity with the sensor), it is can in some cases be more significant for a capacitive displacement sensor (e.g. a sensor responsive to a change in capacitance caused by movement of an object that is already in proximity to the sensor).

There is a desire for apparatus and methods that can help to address these kinds of issues.

SUMMARY OF THE INVENTION

The present disclosure can help address or mitigate at least some of the issues discussed above.

Respective aspects and features of the present disclosure are defined in the appended claims.

It is to be understood that both the foregoing general description and the following detailed description are exemplary, but are not restrictive, of the present technology. The described embodiments, together with further advantages, will be best understood by reference to the following detailed description taken in conjunction with the accompanying drawings.

BRIEF DESCRIPTION OF THE DRAWINGS

The invention is now described by way of example only with reference to the following drawings in which.

DETAILED DESCRIPTION

Aspects and features of certain examples and embodiments of the present invention are discussed/described herein. Some aspects and features of certain examples and embodiments may be implemented conventionally and these are not discussed/described in detail in the interests of brevity. It will thus be appreciated that aspects and features of apparatus and methods discussed herein which are not described in detail may be implemented in accordance with any conventional techniques for implementing such aspects and features.

Certain embodiments of the disclosure are directed to capacitance sensing techniques in which there may be a desire to measure a relatively small change in capacitance against a relatively large background capacitance. As noted above this may be expected to arise relatively often for capacitance-based displacement sensing and as such embodiments discussed further herein may focus on a displacement sensing context. However, it will be appreciated the principles described herein may equally be adopted in the context of more general capacitive sensing. That is to say, while the principles described herein may find particular application in the context of displacement sensing, they are not limited to displacement sensing.

Figure 1:
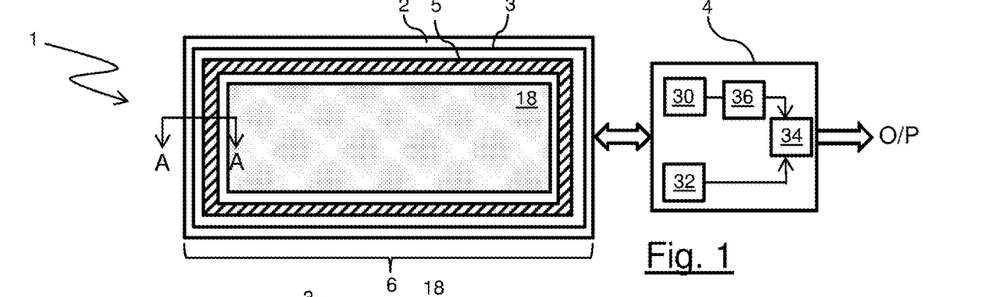
FIG. 1 schematically represents a sensor element and controller element of a sensing apparatus according to certain embodiments of the disclosure.
Figure 2:
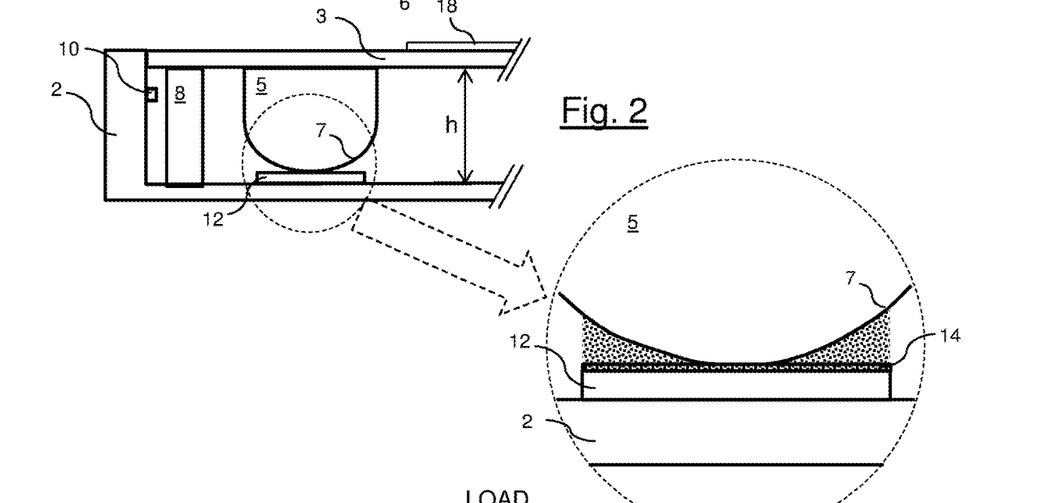
FIG. 2 schematically shows in cross-section a portion of the sensing apparatus of FIG. 1 in a non-displaced state.
Figure 3:
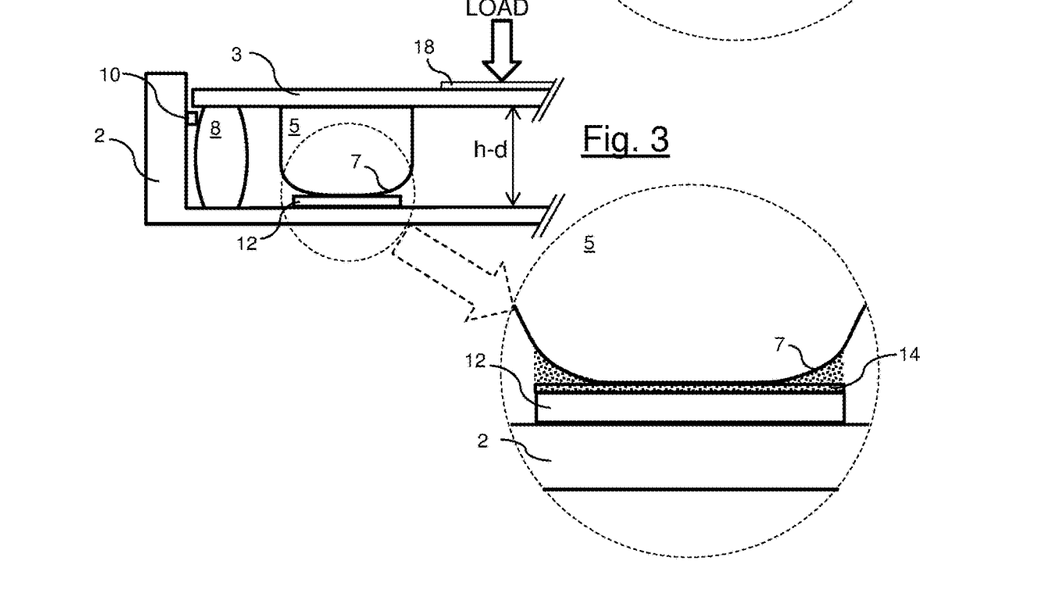
FIG. 3 schematically shows in cross-section a portion of the sensing apparatus of FIG. 1 in a displaced state.

FIGS. 1, 2 and 3 schematically represent various aspects of a sensing apparatus 1 in accordance with certain embodiments of the disclosure. The sensing apparatus 1 comprises a touch-sensitive displacement element 3 that is movably mounted with respect to a frame element 2. The touch-sensitive displacement element 3 comprises a substrate, e.g. formed from glass or plastic, and a touch sensitive element 18 mounted thereon. The sensing apparatus 1 is operable to measure both a displacement of the displacement element 3 and the presence of an object over/touching the displacement element 3 using capacitive sensing techniques. Overall the sensing apparatus 1 comprises two main functional parts, namely a sensor element 6 comprising the displacement element 3 and associated components used for capacitively measuring displacements and touches applied to the displacement element 3, and a controller element 4 comprising capacitance measurement circuitry 30, 32 for measuring capacitances indicative of displacements and touches applied to the sensing element and outputting an analogue indication of measured capacitances, capacitance measurement compensation circuitry 36 for modifying the analogue capacitance measurement signals from the capacitance measurement circuitry 30 as discussed further below, and processor/controller circuitry 34 for receiving, digitising and processing the capacitance measurements from the capacitance measurement circuitry 30 that have been adjusted by the compensation circuitry 36 in accordance with the principles disclosed herein.

The sensor element 6 comprises displacement sensing electrodes 5, 12 for use in detecting displacements of the moveably mounted displacement element 3 with respect to the frame element 2 based on capacitive coupling measurements associated with the displacement sensing electrodes. These capacitive coupling measurements are made using displacement element capacitance measurement circuitry 30 within the controller element 4. The configuration of displacement sensing electrodes and the touch element capacitance measurement circuitry 32 for measuring capacitive couplings associated with the displacement sensing electrodes may be based on conventional techniques for capacitance based displacement sensing except where modified in accordance with the principles described herein. The displacement element capacitance measurement circuitry 30 is configured to measure an amount of capacitance coupled to an input to the capacitance measurement circuitry 30 and to output an analogue signal which comprises an indication thereof. The specific nature of the capacitance measurement circuitry 30 is not of primary significance to the principles described herein and the underlying capacitance measurement technique may in itself be based on conventional techniques.

The touch sensitive element 18 for the sensor element 6 comprises an arrangement of touch sensing electrodes (not shown in the figures) for use in detecting when there is an object touching the displacement element 3 based on capacitive coupling measurements associated with the touch sensing electrodes. These capacitive coupling measurements are made using touch element capacitance measurement circuitry 32 within the controller element 4. In this example the touch sensitive element 18 and associated touch element capacitance measurement circuitry 32 provide a position-sensitive touch sensor, i.e. a touch sensor configured to detect both the presence and also the position of an object (or positions for multiple objects for a multi-touch sensor) over the displacement element. In other examples the touch sensor functionality of the sensing apparatus may simply provide an indication of whether or not there is an object in a touch-sensitive region of the touch sensitive element without any position information. The arrangement of touch sensing electrodes on the displacement element 3 and the touch element capacitance measurement circuitry 32 for measuring capacitive couplings associated with the touch sensitive element may be in accordance with any conventional approaches for touch sensing. In this example it is assumed the touch element capacitance measurement circuitry 32 is configured to provide an output signal to the processing circuitry 34 which comprises an indication of a measured strength and location of a capacitive coupling associated with the presence of an object adjacent to the touch sensitive element in accordance with known techniques.

Thus the sensing apparatus of FIG. 1 includes a displacement sensing function for detecting a displacement of the touch-sensitive displacement element 3 and a touch sensing function for detecting the presence (and in this example also the position) of an object touching the touch-sensitive displacement element 3. Examples discussed herein will primarily focus on applications of approaches in accordance with embodiments of the disclosure in respect of the displacement capacitance measurement circuitry 30. Thus, although the sensing apparatus represented in FIG. 1 includes both a displacement sensing function and a touch sensing function, it will be appreciated other examples may comprise a displacement sensing function without a touch sensing function. More generally, and as already noted, in other examples the approaches disclosed herein may be applied to capacitance measurements made for reasons other than for displacement sensing, for example for touch (proximity) sensing.

The displacement sensing function is provided by the displacement sensing electrodes 5, 12 and associated displacement element capacitance measurement circuitry 30, capacitance measurement compensation circuitry 36 and controller circuitry 34 in the controller element 4. Together the displacement element 3, displacement sensing electrodes 5, 12, and the displacement element capacitance measurement circuitry 30 and capacitance measurement compensation circuitry 36 may thus be considered a displacement sensor with an output that provides an indication of a change in the degree of capacitive coupling between the displacement sensing electrodes.

The touch sensing function is provided by the touch sensing electrodes of the touch sensitive element 18 and associated touch element capacitance measurement circuitry 32 in the controller element 4. Together the touch sensitive element 18 with its touch sensing electrodes and the touch element capacitance measurement circuitry 32 may thus be considered a touch sensor with an output that provides an indication of the degree of capacitive coupling and position associated with an object, e.g. a user's finger, touching the displacement element (in particular touching the touch sensitive element 18 of the displacement element).

As noted above, the specific configurations for the displacement sensor component and the touch sensor component in terms of their physical structure and the core technology underlying their capacitance measurement circuitry may in accordance with some embodiments of the disclosure be based on conventional approaches. However, in accordance with certain embodiments of the disclosure, new approaches are provided for adjusting the outputs from the displacement element capacitance measurement circuitry 30 using the capacitance measurement compensation circuitry to help facilitate the detection of changes in capacitance against a background level capacitance by helping to compensate for the background capacitance.

Having set out some of the operating principles for the sensing apparatus in accordance with certain embodiments, the specific example displacement sensor and the touch sensor implementation represented in FIGS. 1 to 3 will now be described in more detail. FIG. 1 schematically represents the sensor element 6 in plan view and the controller element 4 in highly schematic form (i.e. as functional blocks). FIGS. 2 and 3 respectively show portions of the sensor element 6 of the sensing apparatus 1 in cross-section (taken on the line A-A represented in FIG. 1), with FIG. 2 showing the sensing apparatus 1 in a non-displaced (rest) state and FIG. 3 showing the sensing apparatus 1 in a displaced state.

The sensing apparatus 1 is arranged to measure a displacement of the displacement element 3 relative to the frame element 2, for example in response to a user pressing on or otherwise applying a displacement load to the displacement element 3. The displacement sensor function is based on measuring changes in capacitive coupling associated with a deformable electrode 5 arranged between the displacement element 3 and frame element 2 and a reference electrode 12 (the deformable electrode and reference electrode are the displacement sensing electrodes discussed above). This capacitive coupling is measured by the displacement element capacitance measurement circuitry 30, for example using conventional capacitive measurement techniques. Displacement of the displacement element 3 relative to the frame element 2 causes a change in the capacitive coupling between the deformable electrode 5 and the reference electrode 12 as the deformable electrode 5 deforms under the displacement load. It will be appreciated the use of capacitive sensing technologies to detect displacement may be convenient in certain implementations in that similar controller technologies can be used for sensing displacement and for sensing the presence and positions of objects adjacent the displacement element 3. Also, a capacitive-based displacement sensing approach can be configured to provide an indication of a degree of displacement, as opposed to a simple binary detection. This can be useful in some cases, for example, to allow changes in a desired threshold for establishing when a displacement is deemed to have occurred. For example, the sensitivity to detect displacement may be adjusted by simply changing the threshold at which a displacement is considered to have occurred. Thus, if it is desired that a relatively light touch should be recognised as a displacement, a relatively low threshold can be set, whereas if it is desired that a relatively heavy touch is needed to be considered a displacement, a relatively high threshold could be set. However, as already noted it will be appreciated the specific displacement sensing technology is not significant in the principles described herein and in other implementations other types of displacement sensing technology may be used.

The displacement element 3 is the part of sensor apparatus 1 to which a load may be applied during normal use. The application of an example load during use, e.g. corresponding to a user pressing a finger on the displacement element 3, is schematically shown in FIG. 3 by the arrow labelled "LOAD". For ease of explanation, the side of the displacement element 3 to which the load is applied in normal use may sometimes be referred to herein as the "upper" or "outer" side of the displacement element 3 (or similar terminology such as "top"), with the other side being referred to as "lower" or "inner" (or similar terminology, such as "bottom"). Thus, the surface of the displacement element 3 shown uppermost in the orientation of FIGS. 2 and 3 may sometimes be referred to as the upper/outer/top surface of the displacement element 3. Likewise, the lowermost surface of the displacement element 3 for the orientation of FIGS. 2 and 3 may sometimes be referred to as the bottom/lower/inner surface. Corresponding terms may similarly be used in respect of other parts of the sensing apparatus 1 in accordance with the orientation shown in the relevant figures. However, it will be appreciated this terminology is used purely for convenience of explanation and is not intended to suggest a particular orientation of the sensing apparatus 1 should be adopted in normal use. For example, although in the orientation of FIGS. 2 and 3 the upper surface of the sensor element 6 is shown uppermost, the sensor element 6 could equally be used in a downward facing configuration, or facing outwards from a vertical surface, according to the implementation at hand. More generally, the sensing apparatus 1 may be incorporated in a portable device (such as a tablet computer or mobile telephone), and in that case the orientation in use will vary according to how a user happens to be holding the device.

The frame element 2 provides a structural support for the displacement element 3 and will typically be connected to, or comprise an integral part of, an apparatus in which the sensing apparatus 1 is provided. The frame element 2 may comprise any suitable structural material, for example it may be formed from metal or plastic. The frame element 2 in this example defines a recess/opening into which the displacement element 3 is received and moveably supported therein by a support element 8 arranged around a peripheral part of the displacement element 3. In this example the movable mounting of the displacement element 3 relative to the frame element 2 is provided by virtue of the support element 8 comprising a resiliently compressible material. An upper edge of the support element 8 is bonded to the underside of the displacement element 3 and a lower edge of the support element 8 is bonded to the frame element 2. Conventional bonding techniques can be used for bonding the support element 8 to the other parts of the sensing apparatus 1, for example having regard to bonding techniques appropriate for the materials involved.

The support element 8 in this example is thus generally in the form of a rectangular ring arranged around a peripheral part of the displacement element 3. The support element 8 has a generally rectangular cross-section when in its relaxed state (as shown in FIG. 2), although when the support element 8 is compressed by virtue of a load being applied to the displacement element 3, its sides may bow out to accommodate the movement, as schematically indicated in FIG. 3. It will, however, be appreciated that other shapes could be used in accordance with established mounting practices. For example, more complex shapes for the support element 8 may be chosen to provide different degrees of compressibility according to the degree to which the support element is already compressed. The frame element 2 may include a stop to limit the extent to which the support element 8 may be compressed (i.e. to limit the extent to which the displacement element may be displaced relative to the frame element 2). In this example such a stop is provided by a suitably arranged protrusion 10 from a side wall of the recess defined by the frame element 2. This protrusion 10 may extend all around the recess or may be provided at a number of discrete locations around the recess.

The support element 8 in this example comprises an elastomeric material having an appropriate degree of rigidity and compressibility according to the application at hand (i.e. providing a desired level of resistance to compression). In some cases there may be a desire for a material having relatively low compressibility, thereby requiring a relatively high load to generate a given displacement of the displacement element 3 relative to the frame element 2. Conversely, in some cases there may be a desire for a material having relatively high compressibility, thereby requiring a relatively low load to generate a given displacement of the displacement element 3 relative to the frame element 2. This will be a question of design choice. For example, in the context of displacement sensor forming a user interface a designer may choose how hard the user must press to cause a given displacement. This may be done, for example, to balance the risk of accidental activation against requiring too great a force for activation. A material having the desired degree of compressibility may be selected from modelling or empirical testing, for example.

With reference to FIGS. 2 and 3, the deformable electrode 5 is arranged between the displacement element 3 and the frame element 2 and follows a generally rectangular path around (i.e. within and adjacent to) a peripheral region of the displacement element 3. The deformable electrode 5 has a generally "D" shaped cross-section with a lower curved wall 7, which may also be referred to as a contact surface 7 for the deformable electrode 5. The specific geometry of the deformable electrode 5, e.g. in terms of its cross-sectional size, separation from the peripheral edge of the displacement element 3, and the extent to which it extends around the whole periphery, is not significant to the principles described herein and may vary depending on the specific construction of the sensing apparatus 1.

The deformable electrode 5 may be formed in a number of different ways. In this example the deformable electrode 5 comprises a suitably profiled elastomeric conductive foam; however, other materials may also be used. An electrical connection to the deformable electrode 5 to allow for the measurements discussed further below may be made using one or more conductors in contact with the deformable electrode 5.

Between the deformable electrode 5 and the frame element 2 is the reference electrode 12. The reference electrode 12 is generally in alignment with the deformable electrode 5 and follows a corresponding path beneath the deformable electrode 5. An upper surface of the reference electrode 12 is provided with an electrical insulator layer 14 (shown schematically in the magnified parts of FIGS. 2 and 3). The insulator layer 14 prevents the overlying deformable electrode 5 from coming into direct electrical contact with the reference electrode 12 when the deformable electrode 12 is pressed against the reference electrode 12 during displacement of the displacement element 3 towards the frame element 2.

The reference electrode 12 may be provided in a number of different ways, for example as a conductive trace deposited on the frame element 2. The insulator layer 14 may also be provided in a conventional manner, for example comprising a plastic film or layer of plastic/resin encapsulant over the reference electrode 12. It will, however, be appreciated that different techniques can be used in different implementations. Although the reference electrode 12 is schematically represented in FIGS. 2 and 3 as being disposed on top of the frame element 2, in other examples the reference electrode may be embedded within the frame element 2. If the frame element 2 is conductive, the reference electrode 12 may be insulated therefrom. It will be appreciated the reference electrode 12 and insulator layer 14 might typically be relatively thin compared to the other elements of the sensor element 6 shown in FIGS. 2 and 3, but these figures are not drawn to scale with the reference electrode 12 (and its layer of insulation 14) shown with exaggerated thickness in the cross-sections of FIGS. 2 and 3 for ease of representation.

As noted above, FIG. 2 schematically represents the sensor element 6 in a rest state with no displacement load applied to the displacement element 3. In this example the gap between the upper surface of the frame element 2 and a lower surface of the displacement element 3 is, as indicated in FIG. 2, h. This gap h corresponds with the height of the support element 8 in its relaxed state. In this example the support element 8 is sized to provide a gap h that is slightly less than the height of the deformable electrode 5, such that the deformable electrode 5 is in slight compression so there is a portion of its contact surface 7 for which there is no free space (air gap) between the deformable electrode 5 and the frame element 2, even when in the rest (non-displaced) state.

FIG. 3 schematically represents the sensor element 6 in a displaced state in which a displacement load is applied to the displacement element 3. The displacement load may, for example, be provided by a user's finger pressing on the outer surface of the displacement element 3. The support element 8 and the deformable electrode 5 are both compressed under the action of the displacement load allowing the displacement element 3 to move along a displacement direction towards the frame element 2 by an amount d. The magnitude of the displacement d will be a function of the force (load) applied and the combined resilience of the support element 8 and the deformable electrode 5. The displacement element 3 in FIG. 3 is schematically shown as remaining parallel to the frame element when displaced, but in general it may be expected the displacement element 3 may be tilted depending on the location of the load (i.e. the value of d may be different at different positions across the displacement element 3). In this example the magnitude of the displacement is assumed to be around 0.1 cm.

As a consequence of the deformable electrode 5 being squashed under the displacement load, the curved contact surface 7 is pressed harder against the underlying insulator layer 14. This causes the contact surface 7 to flatten against the insulator layer 14, thereby reducing the overall volume between the deformable electrode 5 and the reference electrode 12 as compared to the rest state represented in FIG. 2. The space between the deformable electrode 5 and the reference electrode 12 is schematically shown with shading in FIGS. 2 and 3, and it can be seen how the shading in FIG. 3 occupies a smaller area than the shading in FIG. 2.

Because the volume of the space between the deformable electrode 5 and the reference electrode 12 is reduced under the displacement load, the capacitive coupling between the deformable electrode 5 and the reference electrode 12 increases when the displacement load is applied. The controller element 4, and in particular the displacement element capacitance measurement circuitry 30, is configured to measure a characteristic of the capacitive coupling associated the two electrodes, thereby allowing a determination as to whether a displacement has occurred to be made as discussed further herein. Connections between the displacement capacitance measurement circuitry 30 and the respective electrodes can be established in accordance with conventional techniques, for example using appropriate wiring. There are various different ways in which a characteristic of the capacitive coupling between the two electrodes can be measured. For example, the mutual capacitive coupling between the two electrodes could be measured by applying a drive signal to one of the electrodes and measuring the extent to which the drive signal is coupled to the other of the electrodes. Alternatively, the self-capacitance of one of the electrodes could be measured with respect to a reference potential whilst the other electrode is connected to the reference potential (e.g. a system ground or other system reference potential). For simplicity the system reference potential may sometimes be referred to herein as a system ground or earth, but it will be appreciated the actual potential itself may be arbitrary and is not significant (e.g. it could be 0V, 5V or 12V, or any other value according to the implementation at hand). In yet another example, one of the electrodes may comprise two components which are capacitively coupled to one another. For example the reference electrode 12 of FIGS. 1 to 3 may be replaced with a reference electrode comprising a pair of parallel or interdigitated conductors which are insulated from one another but in a relatively close proximity on the frame element 2, with the gap between them underlying the deformable electrode 5. The mutual capacitive coupling between the two conductors comprising the reference electrode could be measured by applying a drive signal to one of the conductors and measuring the extent to which the drive signal is coupled to the other of the conductors. The component of the drive signal coupled between the electrodes will generally be reduced as the overlying deformable electrode is compressed onto them under the displacement load. Nonetheless, it will be appreciated the specific capacitive sensing technology used to detect changes in the capacitive coupling between the deformable electrode 5 and the reference electrode 12 is not significant to the principles described herein.

Turning now to the touch sensing function, the sensing apparatus 1 is configured to detect the presence of objects touching the touch sensitive element 18 of the displacement element 3 based on their effect on measurements of capacitive couplings associated with the touch sensing electrodes comprising the touch sensitive element. The touch sensitive element 18 of the displacement element 3 may be based on any known design, and may be constructed from a single layer or multiple, stacked layers, e.g., a one or more electrode layers comprising the touch sensor electrodes (depending on design) and a protective cover layer.

The touch sensor electrodes comprising the touch sensitive element 18 include a number of conductive traces or patches defining the touch sensitive area of the touch sensitive element 18. In this example it is assumed the touch sensitive area of the touch sensitive element extends across a centre region of the displacement element 3 to just inside the position of the deformable electrode 5. However, in other examples the sensitive area of the touch sensitive element may extend further across the surface of the displacement element 3, for example extending over the deformable electrode 5 and the support element 8. The touch sensor electrodes are electrically connected to the touch element capacitance measurement circuitry 32 in the controller element 4, which is configured to measure changes in capacitance couplings associated with the touch sensor electrodes caused by objects adjacent (e.g. touching) the touch sensitive element 18 of the displacement element 3. As will be appreciated there are many well-established techniques for capacitively sensing the positions of objects over a two-dimensional sensing surface, and any of these technologies may be adopted for the touch sensing function of the sensor element 6. In this regard, the specific pattern of electrodes/traces provided across the sensing surface and the associated capacitance measurement techniques provided by the touch element capacitance measurement circuitry 32 will depend on the specific sensing technology adopted. As is conventional, the touch sensor electrodes/traces may be made from any suitable conductive material, such as copper or transparent indium tin oxide (ITO). In some examples, the touch sensor electrodes may be arranged in a grid with overlapping horizontal (X) and vertical (Y) electrodes in a well-established configuration for capacitive sensing.

In essence, signaling associated with the touch sensor electrodes comprising the touch sensitive element 18 provides an indication of a degree of capacitive coupling between one or more objects overlying the touch sensitive element and the touch sensor electrodes. The specific nature of the signaling and the manner in which it indicates a degree of capacitive coupling will depend on the sensing technology adopted. The textbook "Capacitive Sensors: Design and Applications" by Larry K. Baxter, August 1996, Wiley-IEEE Press, ISBN: 978-0-7803-5351-0 [1] summarises some of the principles of conventional capacitive sensing techniques that may be used for measuring capacitance characteristics in accordance with various implementations. More generally, and as already noted, any established techniques for measuring indications of degrees of capacitive couplings between objects and a sensing surface could be adopted.

One example technique for measuring a degree of capacitive coupling uses so-called mutual capacitance measurement techniques. Mutual capacitance can be measured by applying a time varying drive signal to one electrode (e.g., a horizontal electrode) and measuring the extent to which the drive signal is capacitively coupled to another electrode (e.g., a vertical electrode) using conventional capacitance measurement techniques. The magnitude of the mutual capacitive coupling between the electrodes is influenced by the presence of nearby objects, e.g., human fingers. Changes in mutual capacitance measurements may therefore be considered to represent changes in capacitive couplings between nearby objects and the sensing surface.

Another example technique for measuring a degree of capacitive coupling uses so-called self-capacitance measurement techniques. Self-capacitance can be measured by determining the capacitance of an array of electrodes with respect to a reference potential. For example, the self-capacitance of a rectangular array of electrodes can be individually monitored. Changes in the measured self-capacitance for a particular electrode can be considered to represent a change in capacitive coupling between an object adjacent that particular electrode.

It should be understood that the above discussion sets out only some example ways in which capacitive sensing may be implemented for the sensing apparatus and it will be appreciated various other established techniques, or combination of established techniques, may be used for different implementations.

The displacement element 3 in this example is in the form of a planar rectangle, but other shapes may be used. The size of the displacement element 3 may be chosen according to the implementation at hand to provide the desired area over which a displacement load/force is to be detected. Purely for the sake of a specific example, it will be assumed here the displacement element 3 has a size of around 10 cm (width)×5 cm (height)×0.3 cm (thickness). The displacement element 3 in this example is formed generally of a non-conductive material, for example a glass or plastic material, but includes the conductive electrodes/traces comprising the touch sensitive element. The displacement element 3 may be transparent or opaque according to the application at hand. For example, in some implementations a display screen may be provided below the sensor element 6. In this case the displacement element 3 (and any parts of the frame element 2 overlying the display screen) should be transparent, at least to some extent, to allow a user to see the display screen through the sensor element 6. In other cases there may be a desire from a design perspective to hide what is behind the displacement element 3 (for example because there is internal wiring or structural elements of an apparatus in which the sensor element 6 is mounted which are not intended to be visible to the user for aesthetic reasons). In this case the displacement element 3 and/or frame element 2 may be opaque. In such cases, the displacement element 3 may include markings or other form of indicia representing certain functions associated with the device in which the sensing apparatus 1 is to be used, e.g., the letters of the alphabet at positions on the displacement element 3 corresponding to a conventional keyboard layout.

As discussed above and schematically represented in FIG. 1, the controller element 4 comprises functional circuitry blocks comprising the displacement element capacitance measurement circuitry 30, the touch element capacitance measurement circuitry 32, capacitance measurement compensation circuitry 36, and the processing circuitry 34. The controller element 4 thus comprises circuitry which is suitably configured/programmed to provide the functionality of these circuitry blocks as discussed herein using conventional programming/configuration techniques for capacitive sensing applications. While the displacement element capacitance measurement circuitry 30, touch element capacitance measurement circuitry 32, and processing circuitry 34 are schematically shown in FIG. 1 as separate elements for ease of representation, it will be appreciated that the functionality of these components can be provided in various different ways, for example using a single suitably programmed general purpose computer, or field programmable gate array, or suitably configured application-specific integrated circuit (s)/circuitry or using a plurality of discrete circuitry/processing elements for providing different elements of the desired functionality. Furthermore, the functionality of the different functional block may be provided in different ways. For example, the functionality of the capacitance measurement compensation circuit may be provided as a sub-function of the capacitance measurement circuitry 30 or as a sub-function of the processing/controller circuitry 34.

For some implementations of capacitive sensing there may be a desire to detect relatively small changes in a relatively large capacitance. For example, referring to the structural arrangement of the displacement sensor represented in FIGS. 1 to 3, the displacement sensor is responsive to a change in capacitive coupling between the displacement sensing electrodes 5 and 12 when the sensing element is displaced. However, there can also be expected to be a relatively significant capacitive coupling between the displacement sensing electrodes 5, 12 when the displacement sensor is in the non-displaced state (FIG. 2). Thus, there is a desire to detect small changes against a relatively large background capacitance. One issue that can arise with this scenario is schematically represented with reference to FIGS. 4 and 5.

Figure 4:
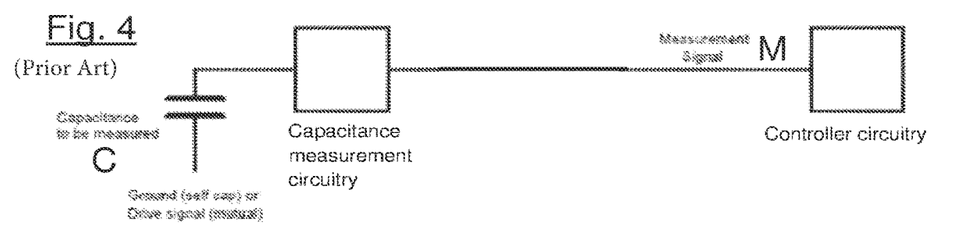
FIG. 4 schematically shows a capacitance sensing circuit according to established techniques.

FIG. 4 schematically represents circuitry for a conventional approach for using capacitance measurement circuitry to measure a capacitance C to generate a measurement signal M for controller circuitry to process to seek to detect a change in the measured capacitance in response to a displacement. The capacitance measurement circuitry may be based on any conventional capacitance measurement techniques, for example self-capacitance sensing techniques (in which case the capacitor terminal schematically shown unconnected in FIG. 4 may be connected to a reference potential) or mutual-capacitance sensing techniques (in which case the capacitor terminal schematically shown unconnected in FIG. 4 may be connected to an appropriate drive signal from the capacitance measurement circuitry).

Figure 5A:
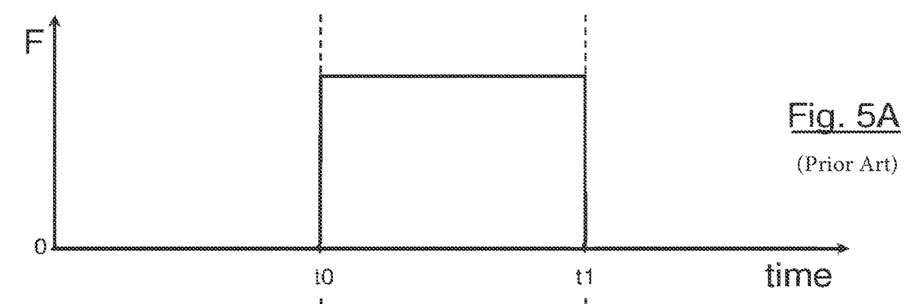
FIGS. 5A to 5C are graphs schematically representing some aspects of the capacitance sensing circuit of FIG. 4 during use.
Figure 5B:
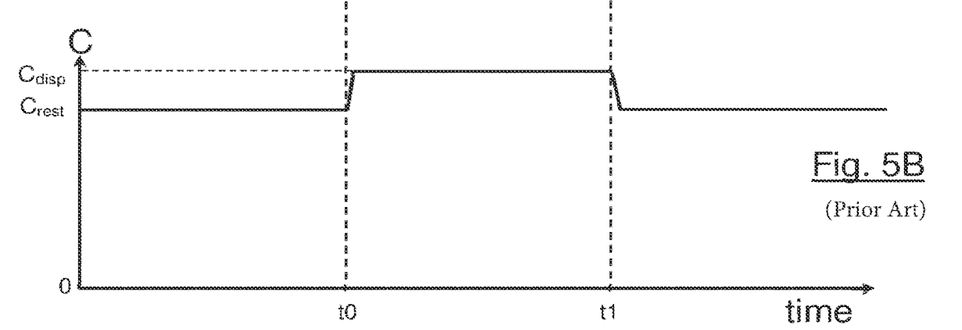
Figure 5C:
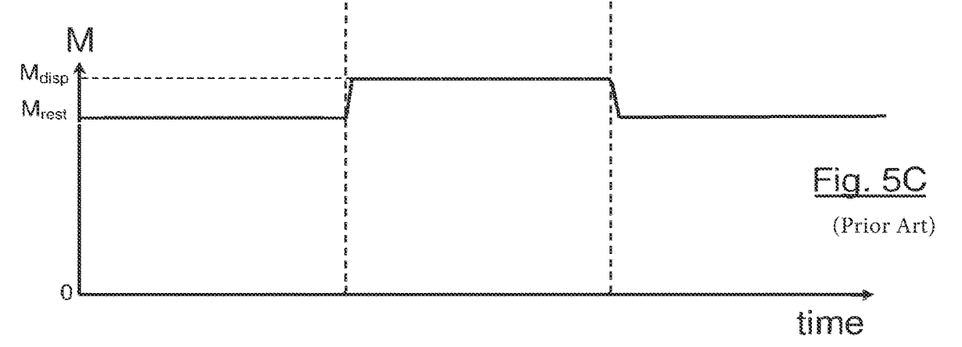

FIGS. 5A to 5C are graphs schematically representing some operational aspects of the conventional circuitry arrangement of FIG. 4 when used to detect a displacement in a displacement sensor. In this example it is assumed a user presses their finger on a displacement element of a displacement sensor to apply a displacement load/force at time t0 and removes their finger (and hence the load/force) at time t1. It is assumed here the displacement sensor is structurally the same as the displacement sensor represented in FIGS. 1 to 3, but differs from displacement sensors in accordance with certain embodiments of the disclosure by not including capacitance measurement compensation circuitry of the kind discussed further herein.

FIG. 5A is a graph schematically showing the force, F, (in arbitrary units) applied by the user's finger as a function of time during the press. Before the user presses on the displacement element at time t0 there is no force applied by the displacement element, between times t0 and t1 the user applies a steady force, and after the user removes their finger at time t1 there is again no force applied by the user. It will be appreciated FIG. 5A represents a somewhat idealised force profile and in practice the force applied by the user may be expected to vary slightly during the touch and to ramp up and ramp down less suddenly than shown in FIG. 5A. However, this is not significant to the principles described herein.

FIG. 5B is a graph schematically showing the capacitance, C, (in arbitrary units) measured by the capacitance measurement circuitry of FIG. 4 for the time period including the displacement event represented in FIG. 5A. Prior to the application of the displacement force at time t0, i.e. when the displacement sensor is in the non-displaced state, the capacitance associated with the displacement sensing electrodes in the displacement sensor measured by the capacitance measurement circuitry is assumed here to have a value $C_{rest}$. When the force is applied (between t0 and t1) and the displacement sensor is in the displaced state the capacitance associated with the displacement sensing electrodes in the displacement sensor measured by the capacitance measurement circuitry is assumed to increase to a value $C_{disp}$. After the removal of the displacement force at time t1, i.e. when the displacement sensor returns to the non-displaced state, the capacitance associated with the displacement sensing electrodes in the displacement sensor measured by the capacitance measurement circuitry returns to $C_{rest}$.

FIG. 5C is a graph schematically showing the analogue input to the controller circuit, M, (in arbitrary units) that is output by the capacitance measurement circuitry of FIG. 4 for the time period including the displacement event represented in FIG. 5A. Prior to the application of the displacement force at time t0, i.e. when the displacement sensor is in the non-displaced state, the capacitance measurement signal M from the capacitance measurement circuit has a value $M_{rest}$ (equivalent to $C_{rest}$—i.e. a value corresponding to that which is output when the capacitance measurement circuitry is measuring a capacitance $C_{rest}$). When the force is applied (between t0 and t1) and the displacement sensor is in the displaced state, the capacitance measurement signal M from the capacitance measurement circuit has a value $M_{disp}$ (equivalent to $C_{disp}$—i.e. a value corresponding to that which is output when the capacitance measurement circuitry is measuring a capacitance $C_{disp}$). After the removal of the displacement force at time t1, i.e. when the displacement sensor returns to the non-displaced state, the capacitance measurement signal M from the capacitance measurement circuit returns to a value $M_{rest}$.

Typically the control circuit receiving the capacitance measurement signal will be configured to digitise and process the measurement signal to identify a change in capacitance that is considered to be associated with a displacement event, potentially also determining an indication of the magnitude of the displacement from the magnitude of the change in capacitance. For example, the control circuit may be configured to identify when there is a change in measured capacitance that is greater than a threshold amount.

As can be seen from the FIG. 5C, the change in the analogue measurement signal from the capacitance measurement circuit is relatively small during a displacement event compared to its value when there is no displacement. That is to say, the difference between the capacitance measurement signal $M_{rest}$ and the capacitance measurement signal $M_{disp}$ is relatively small compared to the capacitance measurement signal $M_{rest}$. A consequence of this is that a significant fraction of the overall dynamic range of the controller is not utilised for detecting the signal of interest.

This reduces the effective detection resolution for a given dynamic range for the controller, resulting in sub-optimal performance in in terms of useable detection resolution or a need for a relatively high dynamic range for the controller.

To help address some of the issues resulting from approaches of the kind represented in FIGS. 4 and 5, new approaches for capacitive sensing are proposed.

In broad summary, certain embodiments of the disclosure differ from existing approaches in how analogue measurement signals from the displacement sensor capacitance measurement circuitry 30 are processed before digitisation by the processing circuitry 34. In particular, in accordance with certain embodiments of the disclosure, compensation circuitry 36 is used to reduce the magnitude of the capacitance measurement signals from the capacitance measurement circuitry 30 so as to provide compensated capacitance measurement signals for the processing circuitry to receive and digitise. The analogue capacitance measurement signals are reduced by subtracting an offset/compensation/adjustment value that is derived from at least one previous analogue capacitance measurement signal.

Figure 6:
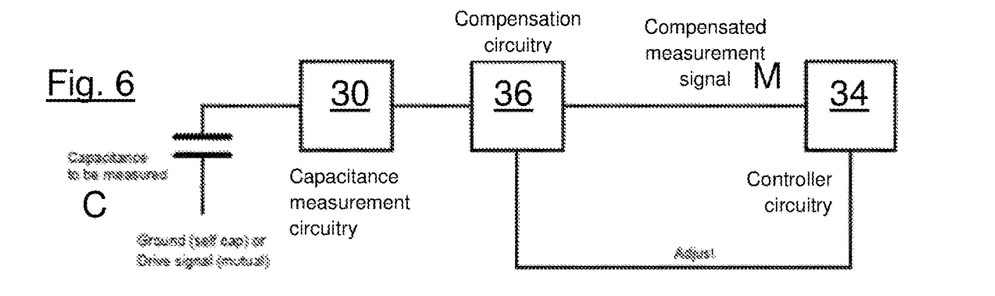
FIG. 6 schematically shows a capacitance sensing circuit according to certain embodiments of the disclosure.
Figure 7A:
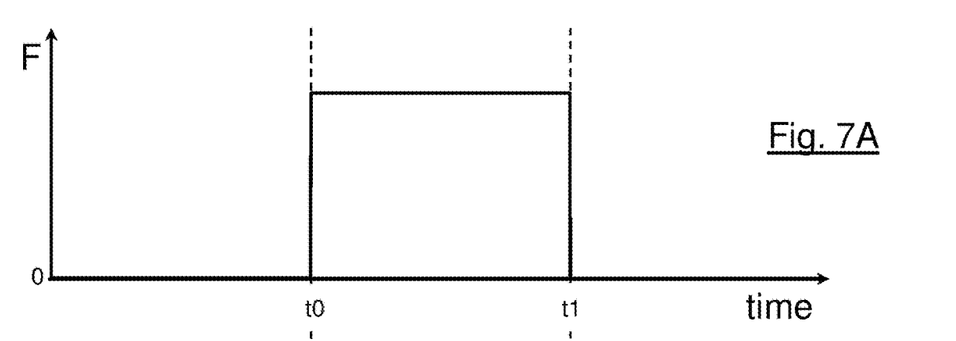
FIGS. 7A to 7C are graphs schematically representing some aspects of the capacitance sensing circuit of FIG. 6 during use.
Figure 7B:
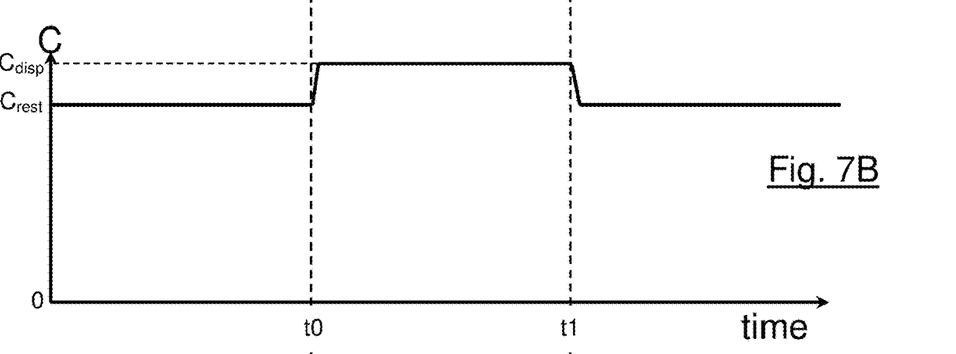
Figure 7C:
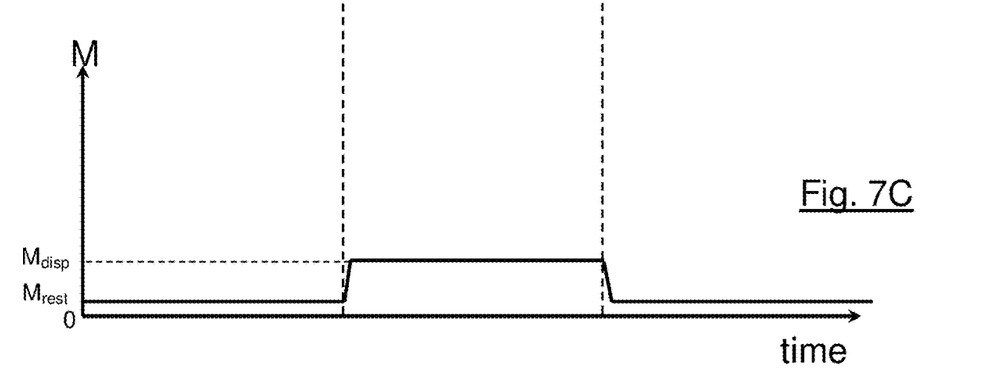

An example implementation of an approach in accordance with certain embodiments of the disclosure is schematically represented in FIGS. 6 and 7.

FIG. 6 schematically represents certain aspects of the circuitry of the apparatus represented in FIGS. 1 to 3 being used to measure a capacitance C (i.e. a capacitance associated with the displacement sensing electrodes 5, 12). Thus the capacitance measurement circuitry is configured to make measurements of the capacitance C coupled to the input of the capacitance measurement circuitry and to generate analogue capacitance measurement signals in response thereto. As noted above, the capacitance measurement circuitry 30 may be based on conventional capacitance measurement techniques, for example self-capacitance sensing techniques (in which case the capacitor terminal schematically shown unconnected in FIG. 6 may be connected to a reference potential, e.g. a system ground) or mutual-capacitance sensing techniques (in which case the capacitor terminal schematically shown unconnected in FIG. 6 may be connected to an appropriate drive signal from the capacitance measurement circuitry 30). The compensation circuitry 36 receives the analogue capacitance measurement signals from the capacitance measurement circuitry 30 and generates compensated analogue capacitance measurement signals, M, therefrom. The compensated analogue capacitance measurement signal for a current analogue capacitance measurement signal is generated by subtracting from the current analogue capacitance measurement signal an amount indicated by an adjustment/compensation signal received from the processing/controller circuitry 34. In accordance with certain embodiments the amount indicated by the compensation signal is derived from at least one previous analogue capacitance measurement signal. The processing circuitry 34 receives the compensated analogue capacitance measurement signals from the compensation circuitry and digitises them for further processing.

The nature of the further processing applied for the digitised compensated capacitance measurement signals will depend on the application at hand. For example, in the context of a displacement sensor such as considered here, the further processing may involve monitoring the digitised compensated analogue capacitance measurement signals to identify if a current compensated capacitance measurement signal differs from a previous compensated capacitance measurement signal by more than a predetermined threshold amount, and if so, outputting a detection signal to indicate there is determined to be a displacement of the displacement element of the displacement sensor. In general, the specific manner in which the digitised compensated capacitance measurement signals are processed is not significant to the principles described herein regarding how the digitised compensated capacitance measurement signals are obtained. For example, in the above-noted displacement sensor context, the magnitude of the threshold which it deems to correspond to a displacement event may be selected in accordance with conventional techniques.

A significant aspect of certain embodiments of the disclosure is that the processing circuitry receives compensated analogue capacitance measurement signals which are reduced in magnitude as compared to the analogue capacitance measurement signals output by the capacitance measurement circuitry. This means the dynamic range/input range requirements of the processing circuitry to allow it to measure the analogue signals representing a measure of the capacitance C may be reduced compared with conventional techniques.

FIGS. 7A to 7C are graphs schematically representing some operational aspects of the circuitry arrangement of FIG. 6 when used to detect a displacement in the displacement sensor apparatus 1. In this example it is assumed a user presses their finger on the displacement element 3 of the displacement sensor to apply a displacement load/force at time t0 and removes their finger (and hence the load/force) at time t1. For ease of comparison with FIGS. 5A to 5C it is assumed here the force applied to the displacement element 3 to provide the displacement load/force for FIGS. 7A to 7C is the same as for FIGS. 5A to 5C.

FIG. 7A is a graph schematically showing the force, F, (in arbitrary units) applied by the user's finger as a function of time during the press. Before the user presses on the displacement element at time t0 there is no force applied to the displacement element, between times t0 and t1 the user applies a steady force, and after the user removes their finger at time t1 there is again no force applied by the user. It will be appreciated FIG. 7A represents a somewhat idealised force profile and in practice the force applied by the user may be expected to vary slightly during the touch and to ramp up and ramp down less suddenly than shown in FIG. 7A. However, this is not significant to the principles described herein.

FIG. 7B is a graph schematically showing the analogue capacitance measurement signal for the capacitance, C, (in arbitrary units) measured by the capacitance measurement circuitry 30 of FIG. 6 for the time period including the displacement event represented in FIG. 7A. Prior to the application of the displacement force at time t0, i.e. when the displacement sensor is in the non-displaced state, the capacitance associated with the displacement sensing electrodes in the displacement sensor measured by the capacitance measurement circuitry is assumed here to have a value $C_{rest}$. When the force is applied (between t0 and t1) and the displacement sensor is in the displaced state the capacitance associated with the displacement sensing electrodes in the displacement sensor measured by the capacitance measurement circuitry is assumed to increase to a value $C_{disp}$. After the removal of the displacement force at time t1, i.e. when the displacement sensor returns to the non-displaced state, the capacitance associated with the displacement sensing electrodes in the displacement sensor measured by the capacitance measurement circuitry returns to $C_{rest}$.

FIG. 7C is a graph schematically showing the analogue input to the controller circuit, M, (in arbitrary units) that is output by the compensation circuitry 36 of FIG. 6 for the time period including the displacement event represented in FIG. 7A in accordance with certain embodiments of the disclosure. As noted above, the compensation circuitry 36 is configured to reduce the magnitude of the analogue capacitance measurement signals represented in FIG. 7B by subtracting an amount indicated by compensation signaling provided to the compensation circuitry 36 by the controller circuitry. In this example it is assumed the amount subtracted from each analogue capacitance measurement signal corresponds to around 90% of the magnitude of a preceding analogue capacitance measurement signal (or average of a number of previous analogue capacitance measurement signals). Further details for examples of how the amount to be subtracted from the analogue capacitance measurement signal may be determined are set out below. Thus, referring to FIG. 7B, prior to the application of the displacement force at time t0, i.e. when the displacement sensor is in the non-displaced state, the capacitance measurement signal M from the capacitance measurement circuit has a value $M_{rest}$ (equivalent to around 10% of $C_{rest}$). When the force is applied (between t0 and t1) and the displacement sensor is in the displaced state, the capacitance measurement signal M from the capacitance measurement circuit increases to a value $M_{disp}$ (equivalent to $C_{disp}$ less 90% of $C_{rest}$). After the removal of the displacement force at time t1, i.e. when the displacement sensor returns to the non-displaced state, the capacitance measurement signal M from the capacitance measurement circuit returns to a value $M_{rest}$. As already noted, the control circuit 34 receiving the capacitance measurement signal is configured to digitise and process the compensated measurement signal to identify if there is a change in capacitance that is considered to be associated with a displacement event, potentially also determining an indication of the magnitude of the displacement from the magnitude of the change in capacitance. For example, the control circuit may be configured to identify when there is a change in measured capacitance that is greater than a threshold amount.

As can be seen from the FIG. 7C, the change in the analogue measurement signal from the capacitance measurement circuit due to the displacement load is a comparable size in absolute terms to that seen in the example shown in FIG. 5C, but in relative terms (i.e. compared to $M_{rest}$) it is much larger. This means the change in the signal caused by the displacement (i.e. the component of interest) is associated with a larger proportion of the dynamic range of the processing circuitry 34 than for the conventional approach represented in FIG. 5C. This means the dynamic range of the processing circuitry 34 for digitising the compensated measurement signals represented in FIG. 7C can be lower than the dynamic range needed for the processing (controller) circuitry for digitising the conventional measurement signals represented in FIG. 5C (resulting in simpler/lower cost circuitry). Alternatively, the same dynamic range may be used to provide higher resolution for digitising the compensated measurement signals represented in FIG. 7C as compared to the conventional measurement signals represented in FIG. 5C. This can be done either by configuring the processing circuitry so its dynamic range spans a smaller analogue input range (since a smaller analogue input range can accommodate the lower signal levels of FIG. 7C as compared to FIG. 7A), or by retaining the same analogue input range and configuring the processing circuitry to amplify the compensated measurement signals to before digitisation to span the analogue input range.

Figure 8:
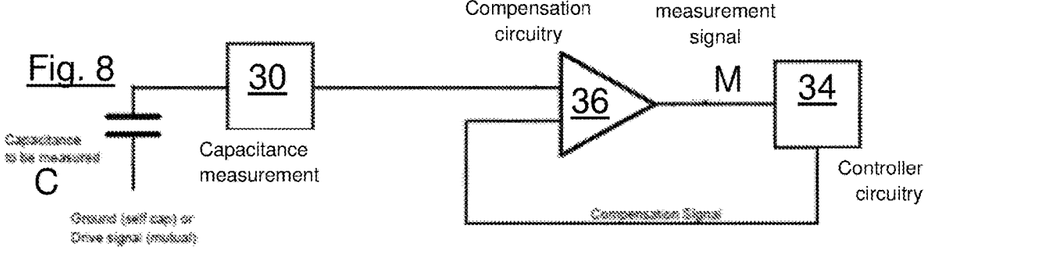
FIGS. 8 and 9 schematically show capacitance sensing circuit according to certain embodiments of the disclosure.
Figure 9:
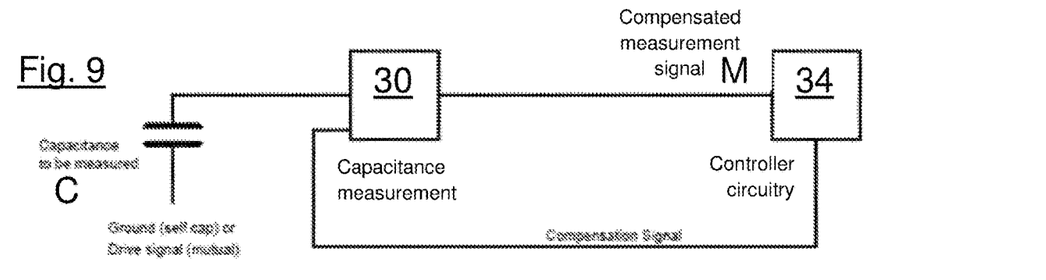

In terms of implementation, the compensation circuitry 36 may be implemented in various ways. For example, the compensated analogue capacitance measurement signal may determined from a difference between the current analogue capacitance measurement signal and an analogue compensation signal from the processing circuitry. Thus, in some examples the compensation circuitry 36 may comprises a differential amplifier having a first input configured to receive a current analogue capacitance measurement signal and a second input configured to receive the compensation signal, such that an output from the differential amplifier is configured to provide the compensated analogue capacitance measurement signal, such as schematically represented in FIG. 8. In some cases the compensation circuitry 36 may be implemented as a separate circuitry from the capacitance measurement circuitry and processing circuitry, but in other cases the circuitry for providing the functionality of the compensation circuitry 36 may be incorporated into the processing circuitry or capacitance measurement circuitry, such as schematically represented in FIG. 9.

It will be appreciated the approaches described herein may be performed iteratively for a series of capacitance measurements. Thus the compensation/adjustment signal indicating an amount to subtract from each analogue capacitance measurement signal may be derived from different previous measurements for different capacitance measurement signals. For example, the compensation/adjustment signal for a current capacitance measurement may be derived from one or more previous capacitance measurements at pre-determined times in advance of the current capacitance measurement (e.g. in a moving time window). For example, the compensation/adjustment signal for a current capacitance measurement may indicate an amount to subtract which is a predetermined proportion (e.g. 90%) of an average of one or more previous capacitance measurements. The predetermined portion may be less than 100% to reduce the chance the compensated capacitance measurement will be reduced to below zero and so not be properly measured by the processing circuitry. In some examples the predetermined proportion may be selected according to an observed variance in previous signals.

One example approach for implementing an embodiment of the disclosure may comprise the following steps:

Step S1: Start processing, for example in response to an apparatus incorporating the displacement sensor being initially turned on.

Step S2: Set an initial value for the current compensation signal. In some cases this may be zero.

Step S3: Make capacitance measurement to generate a current analogue capacitance measurement signal.

Step S4: Subtract current compensation signal from current analogue capacitance measurement signal to provide compensated analogue capacitance measurement signal.

Step S5: Is current compensated analogue capacitance measurement signal greater than a predetermined threshold amount (e.g. an amount corresponding to the maximum of the input range for the processing circuitry)? If no, proceed to step S6, if yes, increase current compensation signal by a predetermined amount and return to step S4.

Step S6: Increase current compensation signal by a predetermined amount.

It will be appreciated the processing discussed above may be modified in different implementations. E.g. in the above example it is assumed the compensation value is tuned (i.e. iteratively incremented/decremented to arrive at an appropriate value) for a single capacitance measurement, whereas in another example the processing may be modified so that a new current capacitance measurement signal is established for each iteration (i.e. the processing from step S5 returns to step S3, rather than step S4, when it is determined the current compensated analogue capacitance measurement signal is greater than the predetermined threshold amount.

The processing discussed above represents an approach for establishing an appropriate compensation value which may then be used on an ongoing basis. That is to say, the processing discussed above may be formed once, for example when an apparatus is first turned on, and the compensation value considered to apply for all capacitance measurements going forward. In principle, the processing may be performed only once in the entire life of a product, for example to establish an appropriate compensation value having regard to the specific arrangement of the displacement sensor, for example to account for malefactor intolerances between different products. In another example the compensation value may be established each time the device is turned on, or in accordance with a regular schedule. In still other examples the compensation value may be established on an ongoing basis so that it is in effect a moving value.

Figure 10:
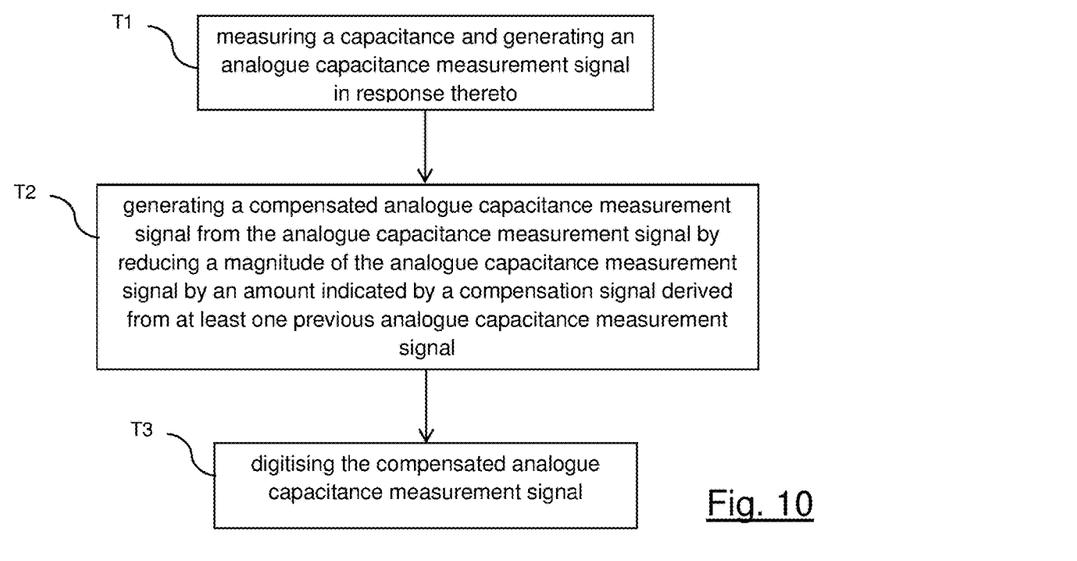
FIG. 10 is a flow chart schematically representing steps in a method according to certain embodiments of the disclosure.

FIG. 10 is a flow diagram representing some of the steps performed in accordance with certain embodiments of the disclosure.

A first step, Step T1, involves measuring a capacitance and generating an analogue capacitance measurement signal in response thereto.

A second step, Step T2, involves generating a compensated analogue capacitance measurement signal from the analogue capacitance measurement signal by reducing a magnitude of the analogue capacitance measurement signal by an amount indicated by a compensation signal derived from at least one previous analogue capacitance measurement signal.

A third step, Step T3, involves digitising the compensated analogue capacitance measurement signal.

Figure 11:
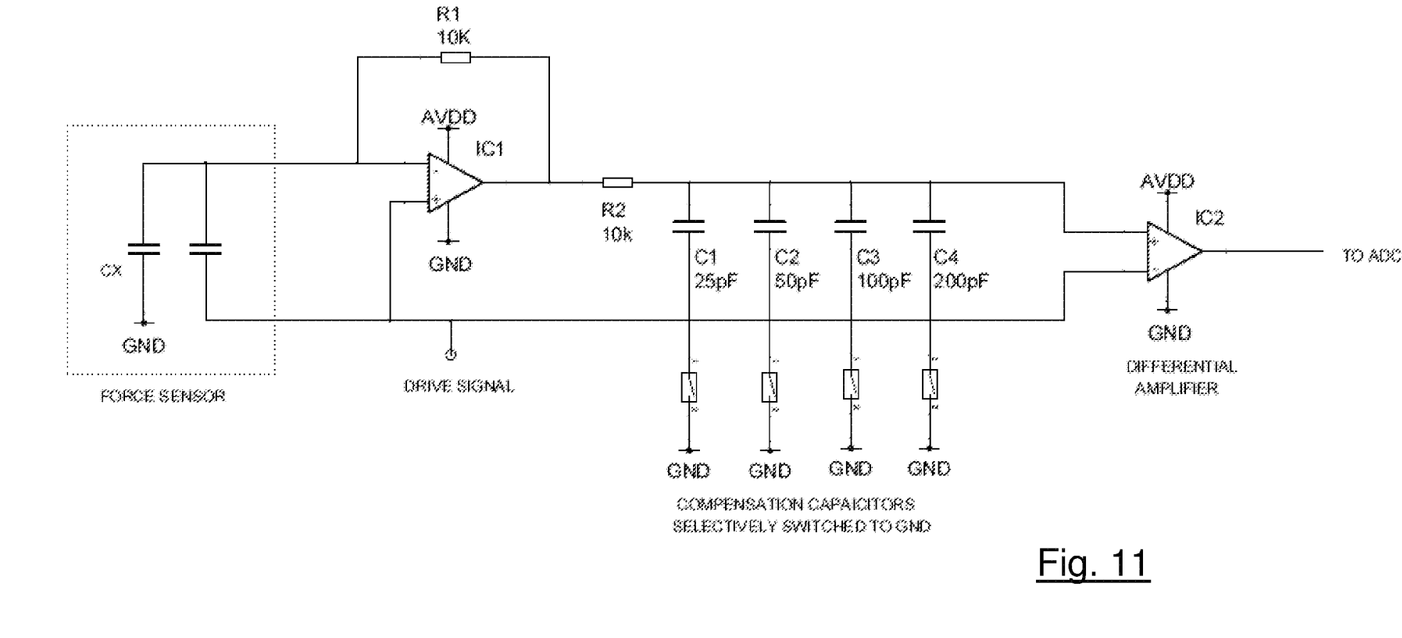
FIG. 11 is schematic circuit diagram representing some components of a sensor element according to certain embodiments of the disclosure.

FIG. 11 is schematic circuit diagram representing some components of a sensor element implementing an approach in accordance with certain embodiments of the disclosure. In this example IC1 and R1 form a transimpedance amplifier. The amplifier drives its output such that the signal at its inverting input is equal to that at its non-inverting input. CX is the capacitance associated with the displacement (force) sensor which is to be measured, e.g. the capacitance between the displacement sensing electrodes 5, 12 in the example senor of FIGS. 1 to 3. For higher values of the capacitance CX the impedance of CX decreases. This means a larger signal is required at the amplifier 101 output to ensure the signal at its inverting input is equal to that at its non-inverting input due to the potential divider action of R1 and CX. Thus the signal level at 101 output increases as the impedance of CX decreases. Capacitors C1, C2, C3 and C4 (in this example having values of 25 pF, 50 pF, 100 pF and 200 pF) may be selectively switched (under control of the controller circuitry) to ground to provide a combined capacitance, referred to as CY, ranging from 0 to 375 pF in 25 pF steps. The selected value of CY in effect provides the selected amount of compensation. R2/CY replicates R1/CX so that the signal at IC2's non-inverting input is the same as that at 101 inverting input (which in turn is the same as the drive signal from the capacitance measurement circuitry). The differential amplifier 102 then amplifies the difference between the original drive signal and the compensated transimpedance signal. If R2/CY were to be exactly equal to R1/CX (i.e. CY=CX) then the output of the differential amplifier 102 would be zero. In practice CY may be selected to have a value slightly less than CX (e.g. using the approach discussed above with reference to the steps S1 to S6) so that the signal is almost but not quite nulled out. Thus from this starting point, any increase in the capacitance of CX (e.g. due to a displacement) results in an increase in the signal level at the differential amplifier 102 output. Significantly, because the output from differential amplifier 102 before the increase in CX (i.e. before displacement) is close to zero due to the standing/baseline capacitance being compensated for by the selectable capacitance CY, the gain of the differential amplifier can be made higher for a given ADC input for the controller, thereby providing higher resolution (or allowing an ADC with fewer bits to provide the same resolution) than would otherwise be the case.

It will be appreciated the range of conversation signal values that may be adopted will depend on the application at hand. In the example of FIG. 11 the capacitors C1 to C4 allow for a compensation value up to 375 pF. In practice this may be selected to correspond with the expected range of values for the standing/baseline capacitance of the capacitance associated with the displacement sensing to allow an appropriate amount of compensation to be obtained.

This to summarise some as aspects of certain example approaches in accordance with the disclosure, there has been proposed an approach that might be referred to as auto-tuning of a standing/background capacitance compensation to increase resolution/decrease dynamic requirements for a capacitance sensor.

The inventors have recognised that when measuring capacitance in touch and displacement sensors, it is a common requirement to measure small changes in capacitance (e.g. fractions of pF) on top of relatively large values of standing capacitance (e.g. hundreds of pF). This is especially true of self-capacitance type measurements and for displacement sensors.

The "raw" (i.e. uncompensated) measurement taken by a capacitance sensor in a displacement sensor will typically consist of a standing 'baseline' or 'reference' value upon which the displacement value or 'delta' value is added when a force is applied. It is the delta value that represents the force applied and is the primary output of interest for the sensor. Because the delta value is typically small compared to the standing value, ordinarily a relatively large dynamic range is required to measure the signal. Furthermore, the standing value itself may be subject to relatively large variation, for example arising from sample to sample manufacturing tolerances and from environmental changes for a given sample.

In accordance with certain embodiments of the disclosure, by subtracting an adjustable offset from the "raw" signal before measuring (i.e. digitising) it, the problem may in some cases be eased. A compensation circuit/signal can be continuously adjusted or a coarser adjustment can be achieved by switching in different components or combinations of components.

In some approaches the sensitivity for a sensor may be increased from the non-compensated case so that the measurement signal is initially 'over-ranged' (too high for the dynamic range of the digitisation circuitry). At start up, the controller may adjust the compensation value until the signal is small enough to be measured and with enough headroom for the expected size of delta signals (which may be established empirically or through modelling of normal usage conditions for the sensor). The compensation approach can allows the sensor gain/sensitivity to be increased, thereby so increasing the resolution of measurements.

Making the compensation adjustable and auto-tuning can help allow the system to cope with large variations in the resting capacitance that can be the result of variations in mechanical assembly. For example, referring to the arrangement of FIG. 1, in circumstances where the displacement sensor compressible electrode is excessively compressed due to assembly tolerance effects, the resting capacitance might be too high for a conventional fixed/non-compensated measurement scheme to deal with. In such a case for a conventional approach the gain of the sensor system would have to be reduced to accommodate the large baseline, which would result in lower overall sensitivity. In the opposite scenario where assembly tolerances lead to a reduced baseline, there is the potential for increased gain and hence sensitivity, but this cannot be achieved with conventional systems without tuned compensation. Auto-tuning compensation in accordance with the principles disclosed herein provide a way to sense the overall baseline at start-up and apply a suitable amount of compensation, so allowing more optimised gain settings over the range of assembly tolerances.

If a compensated signal becomes out of range (e.g. either too high or too low for the processing circuit to properly digitise) during operation (e.g. because of varying environmental conditions for example), this can be addressed by repeating the auto-tune sequence to establish a new compensation value.

Thus there has been described a displacement sensor comprising: a first electrode and a second electrode displaceably mounted relative to the first electrode; capacitance measurement circuitry configured to make measurements of a capacitance associated with the first and second electrodes and to generate analogue capacitance measurement signals in response thereto; compensation circuitry configured to generate a compensated analogue capacitance measurement signal by reducing a magnitude of a current analogue capacitance measurement signal by an amount indicated by a compensation signal derived from at least one previous analogue capacitance measurement signal; and processing circuitry configured to digitise the compensated analogue capacitance measurement signal and to determine if there is a displacement of the second electrode relative to the first electrode based on the compensated analogue capacitance measurement signal.

Further particular and preferred aspects of the present invention are set out in the accompanying independent and dependent claims. It will be appreciated that features of the dependent claims may be combined with features of the independent claims in combinations other than those explicitly set out in the claims.

REFERENCES

[1] Capacitive Sensors: Design and Applications by Larry K. Baxter, August 1996, Wiley-IEEE Press, ISBN: 978-0-7803-5351-0

The invention claimed is:
1. A displacement sensor comprising:
a first electrode and a second electrode displaceably mounted relative to the first electrode;
capacitance measurement circuitry configured to make measurements of a capacitance associated with the first and second electrodes and to generate analogue capacitance measurement signals in response thereto;
compensation circuitry configured to generate a compensated analogue capacitance measurement signal by reducing a magnitude of a current analogue capacitance measurement signal by an amount indicated by a compensation signal derived from at least one previous analogue capacitance measurement signal; and
processing circuitry configured to digitise the compensated analogue capacitance measurement signal and to determine if there is a displacement of the second electrode relative to the first electrode based on the compensated analogue capacitance measurement signal;
wherein the amount indicated by the compensation signal derived from at least one previous analogue capacitance measurement signal corresponds to a predetermined proportion of the at least one previous analogue capacitance measurement signal, and wherein the predetermined proportion is less than 100% to reduce the chance the compensated analogue capacitance measurement signal will be reduced to below zero,
wherein the compensation circuitry is configured to iteratively adjust the compensation signal for a series of analogue capacitance measurement signals by determining for each one of the series of analogue capacitance measurement signals if the corresponding compensated analogue capacitance measurement signal exceeds a predetermined signal level, and if so increasing the compensation signal for a subsequent one of the series of analogue capacitance measurement signals.

2. The displacement sensor of claim 1, wherein the compensated analogue capacitance measurement signal is determined from a difference between the current analogue capacitance measurement signal and the compensation signal.

3. The displacement sensor of claim 2, wherein the compensation circuitry comprises a differential amplifier having a first input configured to receive the current analogue capacitance measurement signal and a second input configured to receive the compensation signal, such that an output from the differential amplifier is configured to provide the compensated analogue capacitance measurement signal.

4. The displacement sensor of claim 1, wherein the compensation circuitry is incorporated in the processing circuitry.

5. The displacement sensor of claim 1, wherein the compensation circuitry is incorporated in the capacitance measurement circuitry.

6. The displacement sensor of claim 1, wherein the compensation circuitry is configured to generate a further compensated analogue capacitance measurement signal by reducing a magnitude of a subsequent current analogue capacitance measurement signal by an amount indicated by a further compensation signal derived from a further at least one previous analogue capacitance measurement signal; and the processing circuitry is further configured to digitise the further compensated analogue capacitance measurement signal.

7. The displacement sensor of claim 6, wherein the compensation signal and the further compensation signal are derived from different previous analogue capacitance measurement signals.

8. The displacement sensor of claim 1, wherein the compensation circuitry is configured to derive the compensation signal from a plurality of previous analogue capacitance measurement signals.

9. The displacement sensor of claim 1, wherein the predetermined signal level is selected according to an input range for the processing circuitry.

10. The displacement sensor of claim 1, wherein the processing circuitry is configured to output a detection signal to indicate there is determined to be the displacement of the first electrode relative to the second electrode in response to determining a difference between a current compensated analogue capacitance measurement signal and a previous compensated analogue capacitance measurement signal is greater than a predetermined threshold amount.

11. An apparatus comprising the displacement sensor of claim 1.

12. A method of sensing displacement comprising:
measuring a capacitance associated with a first electrode and a second electrode displaceably mounted relative to the first electrode and generating an analogue capacitance measurement signal in response thereto;
generating a compensated analogue capacitance measurement signal from the analogue capacitance measurement signal by reducing a magnitude of the analogue capacitance measurement signal by an amount indicated by a compensation signal derived from at least one previous analogue capacitance measurement signal; and
digitising the compensated analogue capacitance measurement signal and determining if there is a displacement of the second electrode relative to the first electrode based on the compensated analogue capacitance measurement signal;
wherein the amount indicated by the compensation signal derived from at least one previous analogue capacitance measurement signal corresponds to a predetermined proportion of the at least one previous analogue capacitance measurement signal, and wherein the predetermined proportion is less than 100% to reduce the chance the compensated analogue capacitance measurement signal will be reduced to below zero,
wherein the compensation circuitry is configured to iteratively adjust the compensation signal for a series of analogue capacitance measurement signals by determining for each one of the series of analogue capacitance measurement signals if the corresponding compensated analogue capacitance measurement signal exceeds a predetermined signal level, and if so increasing the compensation signal for a subsequent one of the series of analogue capacitance measurement signals.

13. The displacement sensor of claim 1, wherein the predetermined portion is about 90%.

14. The method of claim 12, wherein the predetermined portion is about 90%.

15. The method of claim 12, wherein the predetermined portion is selected according to an observed variance in previous signals.

* * * * *